United States Patent
Gumann et al.

(10) Patent No.: US 11,430,831 B2
(45) Date of Patent: Aug. 30, 2022

(54) LAYERED HYBRID QUANTUM ARCHITECTURE FOR QUANTUM COMPUTING APPLICATIONS

(71) Applicant: INTERNATIONAL BUSINESS MACHINES CORPORATION, Armonk, NY (US)

(72) Inventors: Patryk Gumann, Tarrytown, NY (US); Andrew W. Cross, Yorktown Heights, NY (US); Sean Hart, Tarrytown, NY (US); Jay Michael Gambetta, Yorktown Heights, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 159 days.

(21) Appl. No.: 16/907,214

(22) Filed: Jun. 20, 2020

(65) Prior Publication Data
US 2021/0399044 A1 Dec. 23, 2021

(51) Int. Cl.
| | | |
|---|---|---|
| H01L 27/18 | (2006.01) | |
| G06N 10/00 | (2022.01) | |
| H01L 29/16 | (2006.01) | |
| H01L 39/02 | (2006.01) | |
| H01L 39/22 | (2006.01) | |
| H01P 7/08 | (2006.01) | |
| H03K 17/92 | (2006.01) | |

(52) U.S. Cl.
CPC ............ *H01L 27/18* (2013.01); *G06N 10/00* (2019.01); *H01L 29/1606* (2013.01); *H01L 39/025* (2013.01); *H01L 39/223* (2013.01); *H01L 39/228* (2013.01); *H01P 7/086* (2013.01); *H03K 17/92* (2013.01)

(58) Field of Classification Search
CPC ... H01L 27/18; H01L 29/1606; H01L 39/025; H01L 39/223; H01L 39/228; G06N 10/00; H01P 7/086; H03K 17/92
See application file for complete search history.

(56) References Cited

U.S. PATENT DOCUMENTS

| | | | |
|---|---|---|---|
| 5,388,068 A | 2/1995 | Ghoshal et al. | |
| 7,332,738 B2 | 2/2008 | Blais et al. | |
| 9,735,776 B1 | 8/2017 | Abdo | |
| 10,063,228 B2 | 8/2018 | Deurloo et al. | |
| 10,467,544 B2* | 11/2019 | Filipp | G06N 10/00 |
| 10,491,221 B1* | 11/2019 | Mckay | H01P 7/00 |
| 2011/0148441 A1 | 6/2011 | Yamamoto et al. | |

(Continued)

FOREIGN PATENT DOCUMENTS

KR   20090041510 A   4/2009

OTHER PUBLICATIONS

Allen, M.T. et al., "Observation of Electron Coherence and Fabry-Perot Standing Waves at a Graphene Edge"; Nano Letters (2017); vol. 17; pp. 7380-7386.

(Continued)

*Primary Examiner* — Dinh T Le
(74) *Attorney, Agent, or Firm* — Intelletek Law Group, PLLC; Gabriel Daniel, Esq.

(57) ABSTRACT

A quantum system includes a qubit array comprising a plurality of qubits. A bus resonator is coupled between at least one pair of qubits in the qubit array. A switch is coupled between the at least one qubit pair of qubits.

21 Claims, 12 Drawing Sheets

(56) References Cited

U.S. PATENT DOCUMENTS

| | | |
|---|---|---|
| 2017/0308804 A1 | 10/2017 | Wabnig et al. |
| 2018/0101786 A1 | 4/2018 | Boothby |
| 2019/0042967 A1 | 2/2019 | Yoscovits et al. |
| 2019/0164959 A1 | 5/2019 | Thomas et al. |
| 2019/0385088 A1* | 12/2019 | Naaman ................. H04Q 3/523 |

OTHER PUBLICATIONS

Barends, R. et al., "Superconducting Quantum Circuits at the Surface Code Threshold for Fault Tolerance"; Nature (2014); vol. 508; pp. 500-503.
Bialczak, R.C. et al., "Quantum Process Tomography of a Universal Entangling Gate Implemented with Josephson Phase Qubits"; Nature Physics (2010); vol. 6; pp. 409-413.
Casparis, L. et al., "Voltage-Controlled Superconducting Quantum Bus"; arXiv:1802.01327v1 [cond-mat.mes-hall]; (2018); 5 pgs.
Dewes, A. et al., "Characterization of a Two-Transmon Processor with Individual Single-Shot Qubit Readout"; Physical Review Letters (2012); PRL 108; pp. 057002-1-057002-5.
Dicarlo, L. et al., "Demonstration of Two-Qubit Algorithms with a Superconducting Quantum Processor"; Nature (2009); vol. 460; pp. 240-244.
Gambetta, J. M. et al., "Building Logical Qubits in a Superconducting Quantum Computing System"; Nature (2017); 7 pgs.
Lee, J. S. et al., "Transport studies of epi-Al/InAs 2DEG Systems for Required Building-blocks in Topological Superconductor Networks"; California NanoSystems Institute (Date: Unknown); 16 pgs.
Qi, Z. et al., "Controlled-Z gate for Transmon Qubits Coupled by Semiconductor Junctions"; Physical Review (2018); vol. 97; pp. 134518-1-134518-11.
Casparis, L. et al., "Superconducting Gatemon Qubit Based on a Proximitized Two-Dimensional Electron Gas"; Nature Nanotechnology (2018); vol. 13:10, pp. 915-919.
Honibrook, J. M. et al., "Cryogenic Control Architecture for Large-Scale Quantum Computing" Physical Review Applied (2015); vol. 3:2, 9 pgs.
Kjaergaard, M. et al., "Superconducting Quibts: Current State of Play"; arXiv:1905.13641v2 [quant-ph] (2019); 28 pgs.
Van Dijk, J. P. G., "The Electron Interface for Quantum Processors"; Microprocessors and Microsystems (2019); vol. 66; pp. 90-101.
Rosenberg, D. et al., "3D Integrated Superconducting Qubits"; NJP Quantum Information (2017); vol. 3:42 5 pgs.
International Search Report and Written Opinion dated Oct. 1, 2021 in related application No. PCT/EP2021/066161; 17 pgs.

* cited by examiner

LAYERED HYBRID QUANTUM ARCHITECTURE FOR QUANTUM COMPUTING APPLICATIONS

BACKGROUND

Technical Field

The present disclosure generally relates to superconducting devices, and more particularly, to the integration of control logic in quantum arrays.

Description of the Related Art

Superconducting quantum computing is an implementation of a quantum computer in superconducting electronic circuits. Quantum computation studies the application of quantum phenomena for information processing and communication. Various models of quantum computation exist, and the most popular models include the concepts of qubits and quantum gates. A qubit is a generalization of a bit that has two possible states, but can be in a quantum superposition of both states. A quantum gate is a generalization of a logic gate, however the quantum gate describes the transformation that one or more qubits will experience after the gate is applied on them, given their initial state.

Today, a challenge to scaling a quantum processor that includes multiple qubits is controlling interactions between qubits. Coupling between superconducting qubits, such as microwave cross-talk, can be mitigated by detuning their center frequencies. Instead of changing the qubit to qubit coupling constant, the effective coupling can be reduced by making the qubit energies non-degenerate. However, as superconducting qubits scale to larger systems, the increasingly dense spectrum of qubit transition frequencies makes residual couplings more challenging to suppress. Further, rearranging center frequencies of qubits is not only challenging but can also lead to state leakage.

SUMMARY

According to an exemplary embodiment, a quantum system includes a qubit array comprising a plurality of qubits. A bus resonator is coupled between at least one pair of qubits in the qubit array. A switch is coupled between the at least one qubit pair of the qubit array.

In one embodiment, the switch is integrated with a coupling resonator having a Josephson Junction (JJ).

In one embodiment, the switch includes a gate that is coupled to an electron system that is tunable by a voltage on the gate.

In one embodiment, the electron system is configured to change an inductance based on a voltage on the gate.

In one embodiment, the gate is configured to tune the switch between (i) a low inductance state with a first critical current and (ii) a high inductance state with a second critical current, wherein the second critical current is lower than the first critical current.

In one embodiment, the switch has a first state that supports a supercurrent and a second state that supports a high resistance and no supercurrent.

In one embodiment, the voltage on the gate is operative to change an inductance of the JJ.

In one embodiment, the switch includes two or more superconductors that are separated by the electron system.

In one embodiment, the electron system comprises graphene.

In one embodiment, the switch is a voltage-controlled super current switch.

In one embodiment, for at least one qubit of the qubit array, a switch is coupled between the at least one qubit and a readout resonator of the qubit array.

In one embodiment, a combination of the switches between qubit pairs and qubits and readout resonators is configured to multiplex individual qubits in the array such that each qubit is individually controlled and independent of qubit frequency.

In one embodiment, the qubit array is part of a plurality of qubit arrays in a first layer. The plurality of qubit arrays of the first layer are each isolated by one or more switches.

In one embodiment, there is asymmetry in the qubit arrays between at least two layers of the plurality of layers.

In one embodiment, the quantum system includes a plurality of layers, each having at least one qubit array separated by one or more switches from adjacent layers.

In one embodiment, two or more qubits in the qubit array have a substantially similar qubit frequency.

In one embodiment, the multiple layers are stacked on top of one another by way of bump bonding.

In one embodiment, at least one of the qubits of the qubit array is shut OFF by the at least one switch.

According to one embodiment, a method of controlling quantum system, includes providing a qubit array having a plurality of qubits. A bus resonator is coupled between each pair of qubits in the qubit array. At least one of: (i) at least one qubit pair of the qubit array is separated by way of a Josephson Junction (JJ) switch, or (ii) at least one qubit of the qubit array is separated from a readout resonator by way of a second JJ switch.

In one embodiment, an inductance of an electron system of a gate of the JJ switch is changed by applying a voltage on the gate of the JJ switch.

In one embodiment, two or more superconductors are separated by the electron system of the JJ switch.

In one embodiment, individual qubits are multiplexed by a plurality of switches including the JJ switch and the second JJ switch in the array, such that each qubit is individually controlled and independent of qubit frequency.

In one embodiment, qubit arrays are stacked in a plurality of layers. Each qubit of the plurality of layers is individually controlled by a plurality of switched and independent of qubit frequency.

According to one embodiment, a qubit system includes a qubit array comprising a plurality of qubits. A bus resonator is coupled between each pair of adjacent qubits in the qubit array. At least one of: (i) a switch is coupled between each qubit pair of the qubit array, or (ii) for at least one qubit of the qubit array, a switch is coupled between the at least one qubit and a readout resonator of the qubit array.

In one embodiment, the switch is integrated with a coupling resonator having a Josephson Junction (JJ). Each switch includes a gate that is coupled to an electron system that is tunable by a voltage on the gate. The electron system is configured to change an inductance of the JJ based on a voltage on the gate.

In one embodiment, a combination of the switches between qubit pairs and qubits and readout resonators is configured to multiplex individual qubits in the array such that each qubit is individually controlled and independent of qubit frequency.

These and other features will become apparent from the following detailed description of illustrative embodiments thereof, which is to be read in connection with the accompanying drawings.

BRIEF DESCRIPTION OF THE DRAWINGS

The drawings are of illustrative embodiments. They do not illustrate all embodiments. Other embodiments may be used in addition or instead. Details that may be apparent or unnecessary may be omitted to save space or for more effective illustration. Some embodiments may be practiced with additional components or steps and/or without all the components or steps that are illustrated. When the same numeral appears in different drawings, it refers to the same or like components or steps.

DETAILED DESCRIPTION

Overview

In the following detailed description, numerous specific details are set forth by way of examples to provide a thorough understanding of the relevant teachings. However, it should be apparent that the present teachings may be practiced without such details. In other instances, well-known methods, procedures, components, and/or circuitry have been described at a relatively high-level, without detail, to avoid unnecessarily obscuring aspects of the present teachings.

The present disclosure generally relates to superconducting devices, and more particularly, to the integration of control logic in quantum arrays as well as between quantum arrays. The electromagnetic energy associated with a qubit can be stored in so-called Josephson Junctions (JJs) and in the capacitive and inductive elements that are used to form the qubit. In one example, to read out the qubit state, a microwave signal is applied to the microwave readout cavity that couples to the qubit at the cavity frequency, sometimes referred to herein as the qubit frequency. The transmitted (or reflected) microwave signal goes through multiple thermal isolation stages and low-noise amplifiers that are used to block or reduce the noise and improve the signal-to-noise ratio. The amplitude and/or phase of the returned/output microwave signal carries information about the qubit state, such as whether the qubit has dephased to the ground or excited state. The microwave signal carrying the quantum information about the qubit state is usually weak (e.g., on the order of a few microwave photons). To measure this weak signal, low-noise quantum-limited amplifiers (QLAs), such as Josephson amplifiers and travelling-wave parametric amplifiers (TWPAs), may be used as preamplifiers (i.e., first amplification stage) at the output of the quantum system to boost the quantum signal, while adding the minimum amount of noise as dictated by quantum mechanics, in order to improve the signal to noise ratio of the output chain. In addition to Josephson amplifiers, certain Josephson microwave components that use Josephson amplifiers or Josephson mixers such as Josephson circulators, Josephson isolators, and Josephson mixers can be used in scalable quantum processors.

The ability to include more qubits is salient to being able to realize the potential of quantum computers. To increase the computational power and reliability of a quantum computer, improvements are needed along two main dimensions. First, is the qubit count itself. The more qubits in a quantum processor, the more states can in principle be manipulated and stored. Second, is low error rates, which is relevant to manipulate qubit states accurately and perform sequential operations that provide consistent results and not merely unreliable data. Thus, to improve fault tolerance of a quantum computer, a large number of physical qubits should be used to store a logical quantum bit. In this way, the local information is delocalized such that the quantum computer is less susceptible to local errors and the performance of measurements in the qubits' eigenbasis, similar to parity checks of classical computers, thereby advancing to a more fault tolerant quantum bit.

In principle, quantum error correcting codes enable reliable large-scale quantum computing. Codes such as the surface code are currently favored because they can be implemented in a two-dimensional array of quantum bits, where each of those qubits is constrained to interact only with its neighbors. This constraint implies that each logical qubit is encoded into a patch of physical qubits whose diameter must grow as the error correcting capability increases. Hundreds or even thousands of physical qubits may be used for each logical qubit in this case. In one embodiment, the proposed architecture relaxes this constraint and allows small numbers of physically distant qubits to interact. In a system such as this, where interactions are described by a graph of small constant degree, it is possible to implement more efficient families of quantum error correcting codes. For example, quantum expander codes can encode many logical qubits into the same code block of a high rate code so that asymptotically the overhead can approach a small constant.

Figure 1:
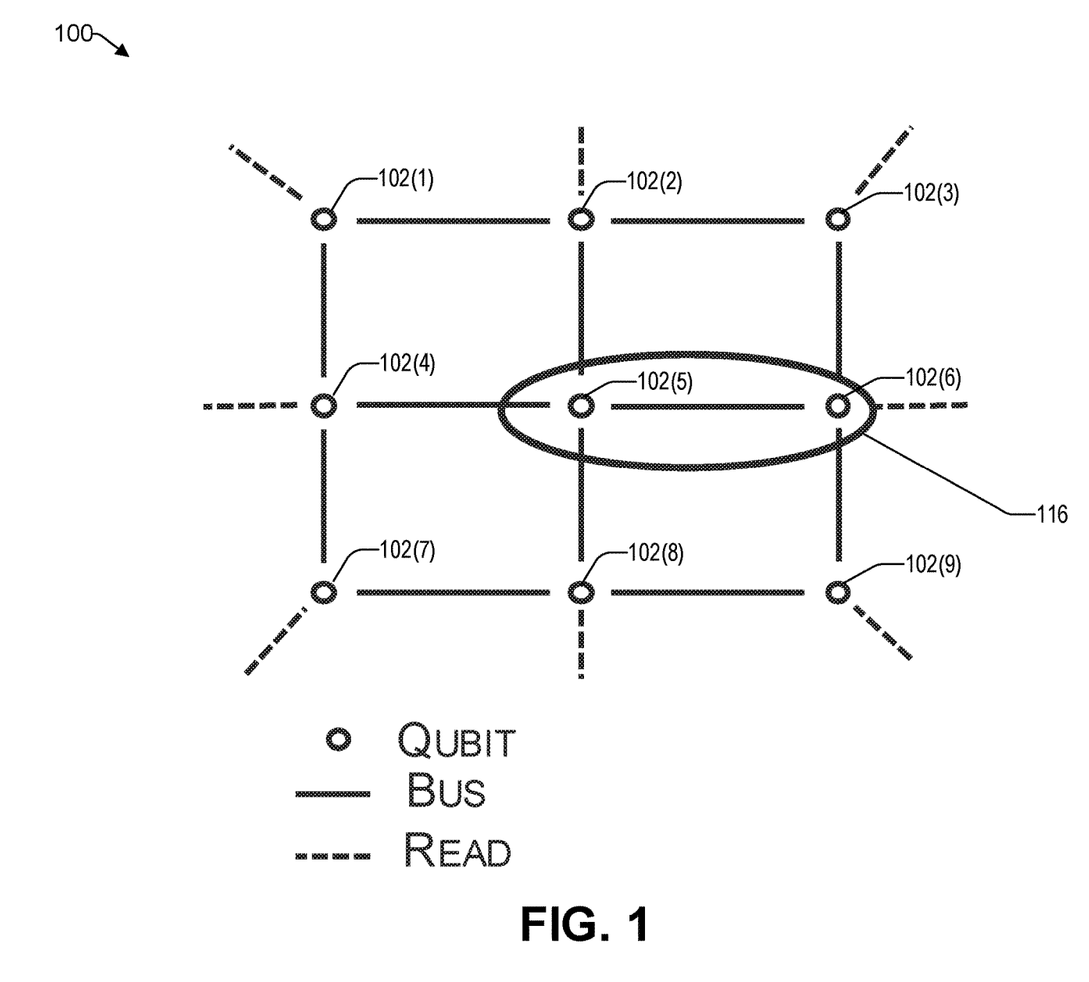
FIG. 1 illustrates an example architecture of a qubit array.

Reference now is made to FIG. 1, which illustrates an example architecture of a qubit array. For example, the qubit array 100 may be based on a surface code architecture which places qubits, represented in FIG. 1 by circles, on a planar two-dimensional (2D) grid, sometimes referred to herein as a lattice. By way of example only, and not by way of limitation, the qubit array is a lattice of 9 qubits arranged as 3×3, while it will be understood that other sizes and configurations are supported by the teachings herein. Each of the qubits 102(1) to 102(9) communicate using coplanar waveguide (CPW) resonators, sometimes referred to herein as bus resonators, represented in FIG. 1 by solid lines. Each pair of qubits (e.g., 116) is coupled together via capacitive coupling. These bus resonators can be used, for example, to entangle two or more qubits, such as the qubit pair 116.

A qubit state is measured using resonant read lines, sometimes referred to herein as readout resonators, represented in FIG. 1 by dashed lines. In one embodiment, the readout resonators are CPWs. These readout resonators are used to determine a state of a corresponding qubit.

As mentioned previously, to maintain signal integrity of each qubit, it would be beneficial for each qubit 102(1) to 102(9) in the lattice to have a different qubit frequency. For example, qubit 102(1) may have a qubit frequency of 5 GHz, qubit 102(2) may have a qubit frequency of 5.5 GHz, qubit 102(3) may have a qubit frequency of 5.7 GHz, etc. In this way, an unentangled state of each individual qubit can be readily achieved and frequency collision avoided between qubits, such as qubits 116. Without having different qubit frequencies, the microwave cross-talk between two qubits (e.g., qubit pair 116) may be subject to frequency collision and cause low performance of quantum computers. However, today's fabrication processes may not be able to achieve adequate control of the qubit frequencies of each individual qubit 102(1) to 102(9) in a qubit array 100.

Accordingly, the teachings herein provide isolation between qubits while being able to accommodate qubits in a qubit array having substantially similar qubit frequencies, thereby reducing sensitivity to semiconductor process capability in controlling qubit frequencies. Qubits in an array can be decoupled from each other, thereby providing a substantially reduced microwave cross-talk while avoiding frequency collision. By virtue of the teachings herein, qubits in an array can be unentangled despite having a substantially similar qubit frequency. Further, coherence time of a qubit is improved.

Example Hybrid Quantum Architectures

Figure 2:
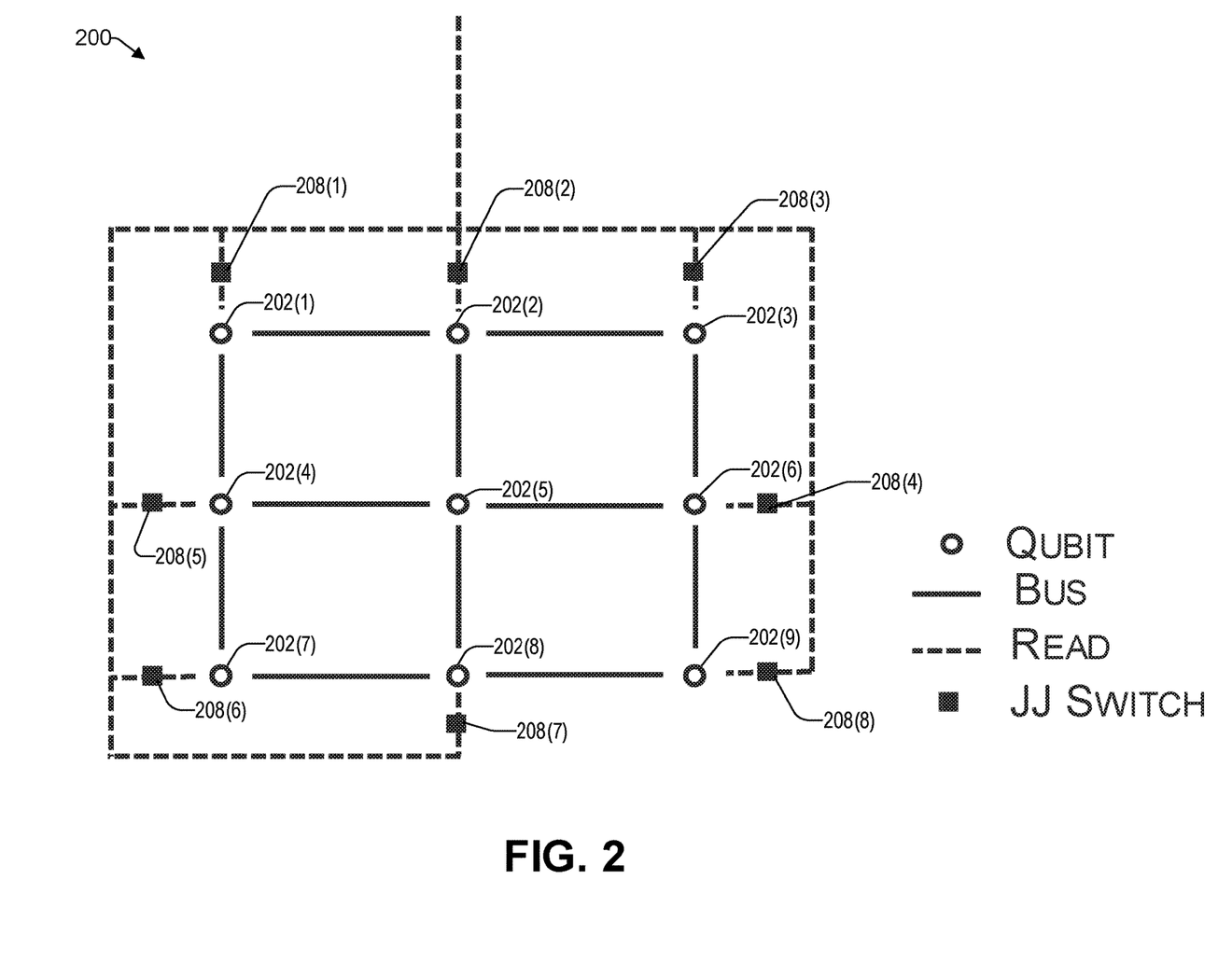
FIG. 2 is an example architecture of a qubit array having isolation between qubits and corresponding readout resonators, consistent with an illustrative embodiment.

FIG. 2 is an example architecture 200 of a qubit array having isolation between qubits and corresponding readout resonators, consistent with an illustrative embodiment. The architecture 200 has features similar to those discussed with respect to the architecture of FIG. 1, which are therefore not repeated here for brevity. By way of example only and not by way of limitation, the qubit array 202(1) to 202(9) of FIG. 2 is a lattice comprising 9 interconnected qubits. Each of the qubits are coupled together by way of bus resonators, represented by solid line. In contrast to FIG. 1, the architecture 200 of FIG. 2 includes switches (e.g., 208(1) to 208(4)) located between a readout line, sometimes referred to herein as a readout resonator, represented by the dashed line, and a corresponding qubit (e.g., 202(1) to 202(9)).

For example, to access qubit 202(1), switch 208(1) can be activated by an appropriate signal (e.g., predetermined voltage), while the remaining switches 208(2) to 208(9) are not activated. In this way, a single readout line can be used to access all qubits in an array via a respective switch, whereby microwave cross-talk is mitigated, even if the qubit frequencies are substantially similar in one or more qubits in the qubit array. In one embodiment, there is a readout resonator (not shown) for the center qubit 202(5), which can be accessed, for example, with bump bonding techniques. Accordingly, some readout resonators, such as the center qubit 202(5) readout resonator, may substantially reside on a separate layer.

Figure 3:
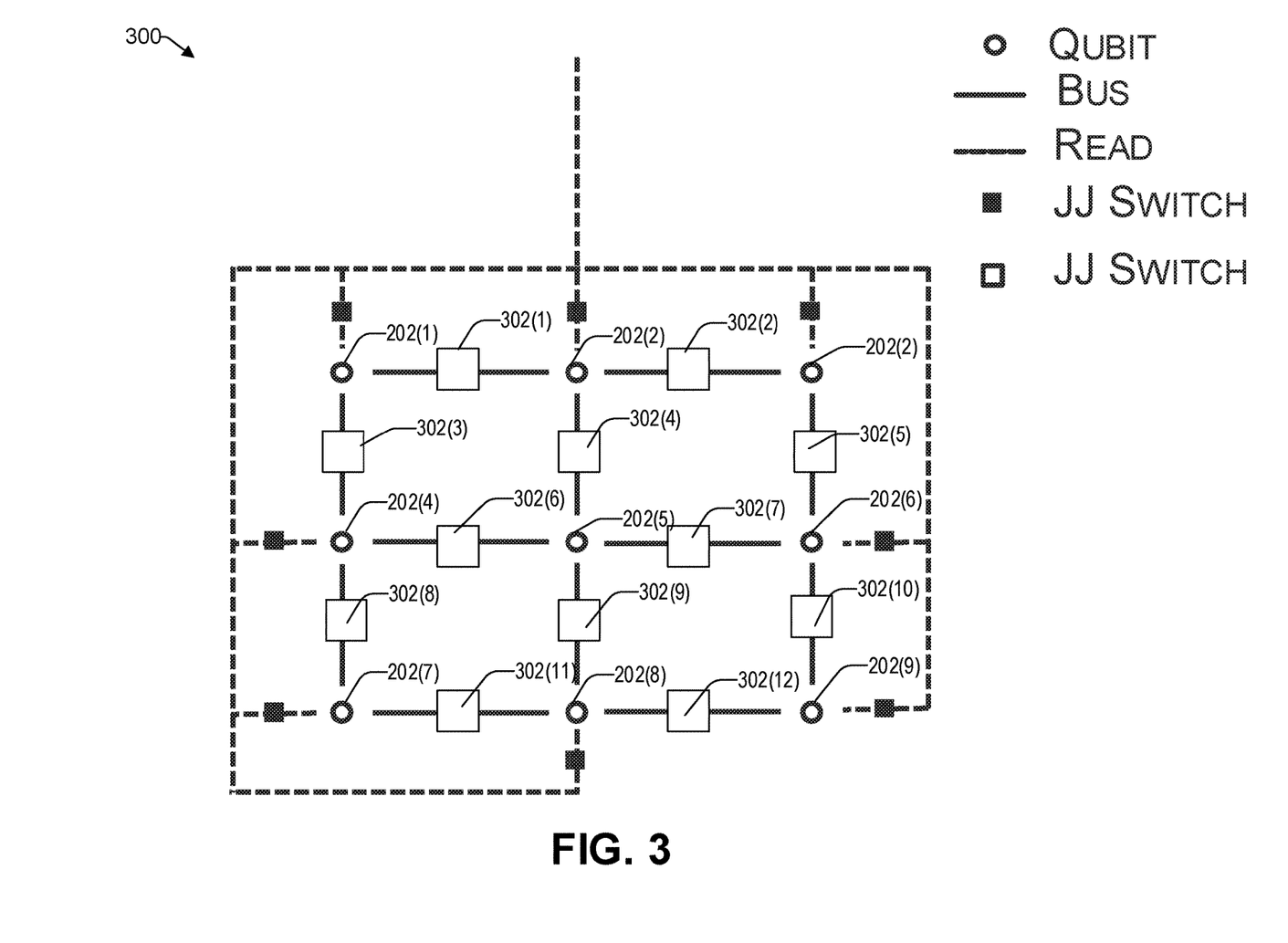
FIG. 3 is an example architecture of a qubit array having isolation between different types of components, consistent with an illustrative embodiment.

Reference now is made to FIG. 3, which is an example architecture 300 of a qubit array having isolation between different types of components, consistent with an illustrative embodiment. The architecture 300 has features similar to those discussed in the context of FIGS. 1 and 2, which are therefore not repeated here for brevity. Architecture 300 includes a switch between pairs of qubits, represented in FIG. 3 as hollow squares 302(1) to 302(12). For example, qubits 202(1) and 202(2) are separated by a switch 302(1). While architecture 300 is pictured with JJ switches between readout resonators and qubits (i.e., solid black squares), in various embodiments, JJ switches 302(1) to 302(12) may also be in architectures without the JJ switches between the readout resonator and the qubits 202(1) to 202(9). In some embodiments, the switches (302(1) to 302(12)) between the qubits and/or the switches between the qubits (i.e., represented in FIG. 3 as solid black squares) and the readout resonators are Josephson Junctions (JJs). The combination of switches in architecture 300 provide multiplexing of the corresponding qubits 202(1) to 202(9). For example, an input/output (I/O) line can be split, divided into many I/O lines, thereby creating a tree structure. The switches can open or close access to various lines enabling or disabling control of qubits. Accordingly, by virtue of multiplexing, a combination of switches can be used to excite a particular qubit, without any interference from adjacent qubits, even if the qubits have a substantially similar qubit frequency.

Figure 4:
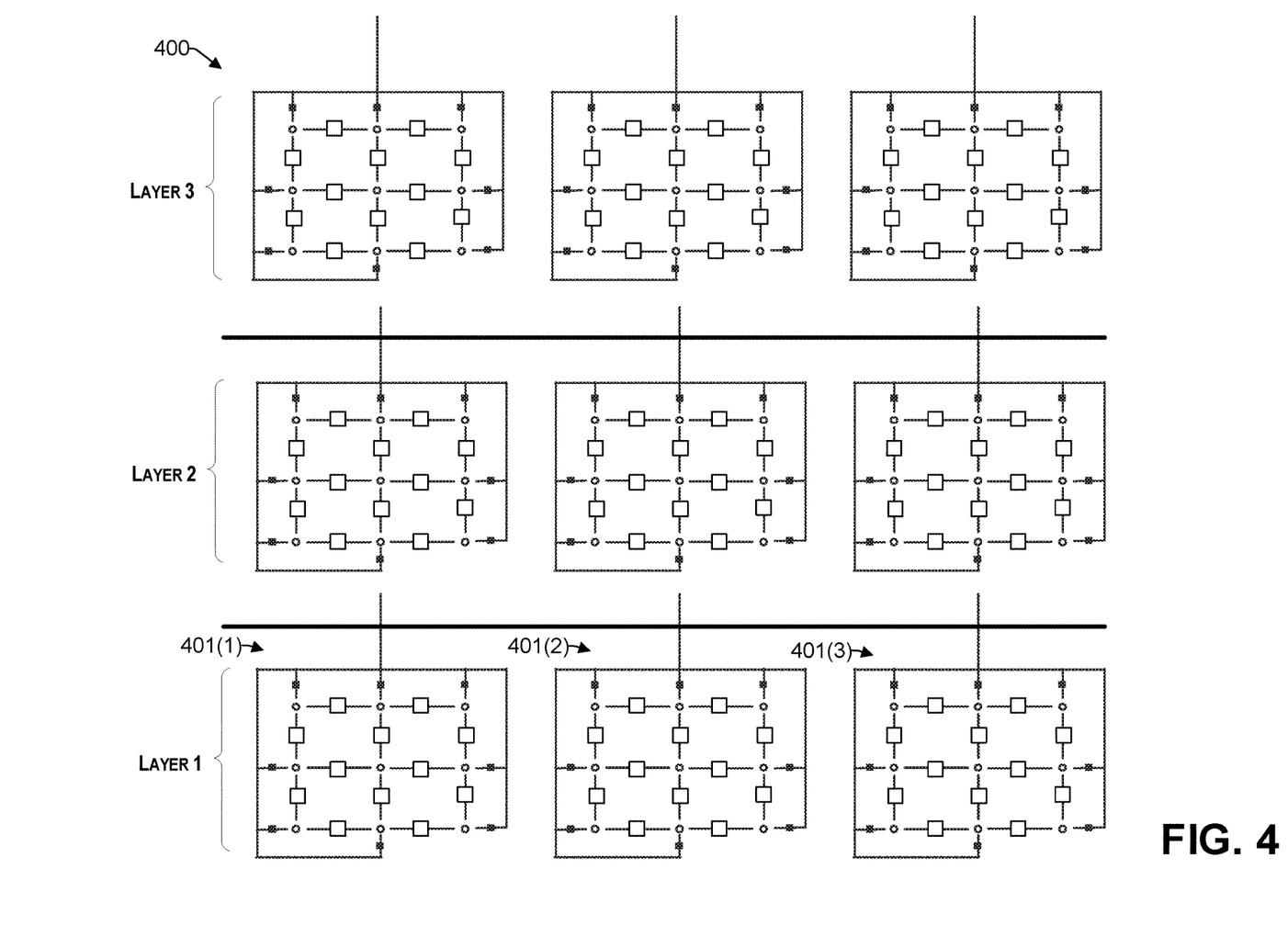
FIG. 4 illustrates an example three-dimensional multiplexed architecture, consistent with an illustrative embodiment.

The teachings herein are not limited to two dimensional configurations. Indeed, the quantum architecture discussed herein can be applied to multi-layer architectures as well. In this regard, FIG. 4 illustrates an example three dimensional (3D) multiplexed architecture 400, consistent with an illustrative embodiment. In the example of FIG. 4, there is symmetry not only in each array of a layer, but also between layers. For example, each layer may comprise a plurality of qubit arrays, such as 401(1) to 401(3) in layer 1 of FIG. 4. Each qubit array may include (e.g., JJ) switches between readout resonators and/or between qubits. Each of these qubit arrays 401(1) to 401(3) is placed in line and equally spaced from one another. Substantially similarly symmetric layers are stacked on top of one another on layers 2 and 3 of FIG. 4. In some embodiments, there could be a separate patch for each qubit array, or all qubit arrays can be tied together by switches for full multiplexing (not shown). By virtue of the teachings herein, a symmetric 3D qubit array with multiplexed readout can be achieved, while protecting each qubit from outside noise, as well as between qubits, even if at least some of the qubits have a substantially similar qubit frequency.

Figure 5:
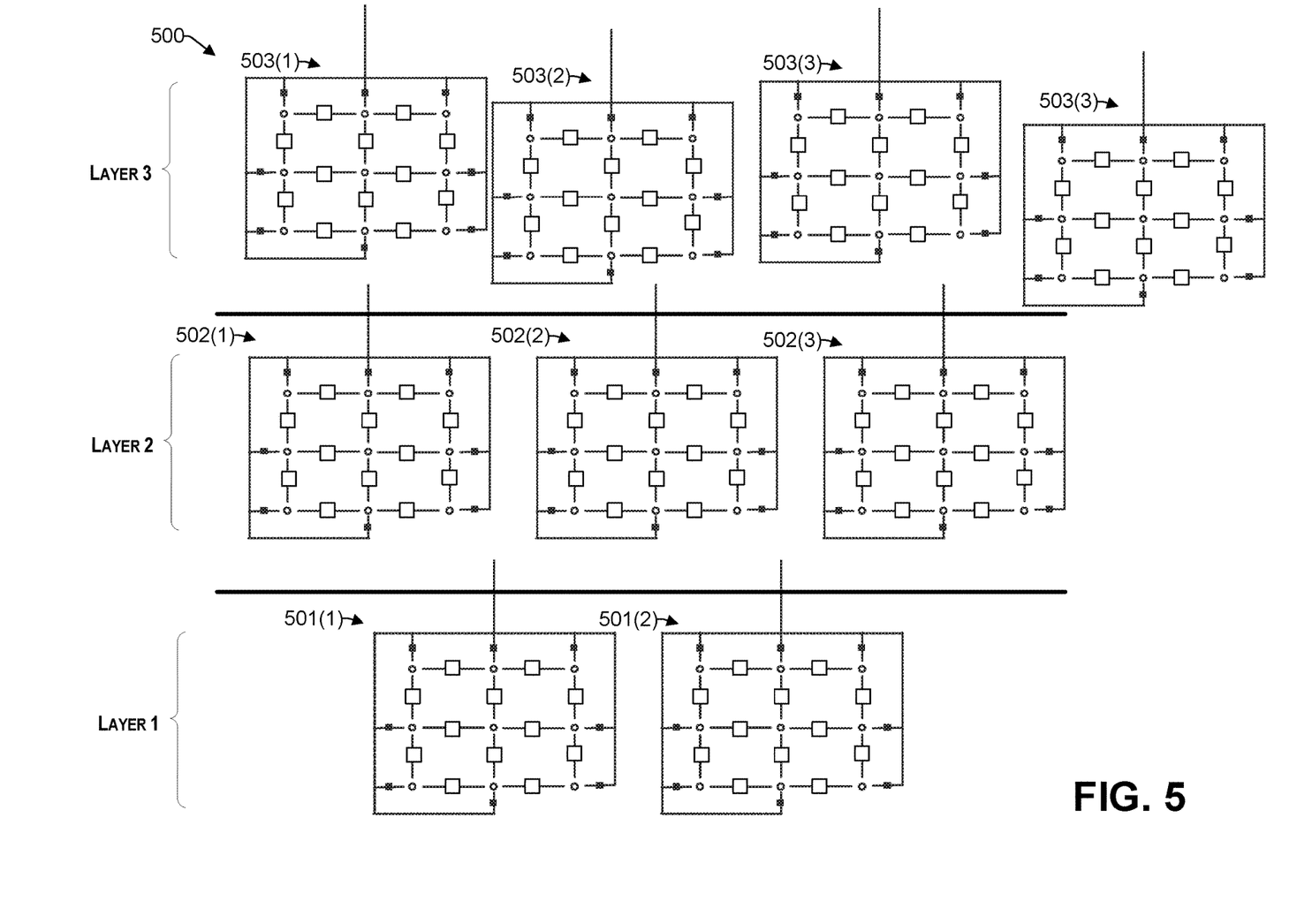
FIG. 5 illustrates a three-dimensional multiplexed architecture without symmetry between the different layers.

It should be noted that in various embodiments, there need not be symmetry within layers or between layers. In this regard, FIG. 5 illustrates a 3D multiplexed architecture 500 without symmetry between the different layers. For example, each layer may have an independent arrangement and/or different number of qubit arrays, as illustrated between layers 1 and 2 of FIG. 5. Layer 1 has two qubit arrays 501(1) and 501(2), whereas layer 2 has three qubit arrays 502(1), 502(2) and 502(3). Further, there need not even be symmetry between qubit arrays on a common layer, as illustrated by qubit arrays 503(1) to 503(3) of layer 3 of FIG. 5. Still further, while each qubit array 501(1) to 503(3) is illustrated as having a common lattice (e.g., 3λ3), the lattice may be different between layers or even within layers. Accordingly, the teachings herein support a multi-layer qubit architecture that is asymmetrical not only between layers but also within each layer. In one embodiment, the multiple layers of qubit arrays are stacked by way of bump bonding.

The architectures 200 to 500 provide an increased coherence time (e.g., survival of the quantum state), even if the qubit frequencies of one or more qubits is substantially similar. Further, by virtue of the multiplexed architecture provided by way of the switches placed at the strategic locations discussed herein, qubits with unwanted transition frequencies can be shut off, thereby avoiding cross-talk emanating therefrom. In one example, a malfunctioning or simply undesired qubit can be turned OFF by virtue of the combination of switches discussed herein.

Example Switch

Figure 6:
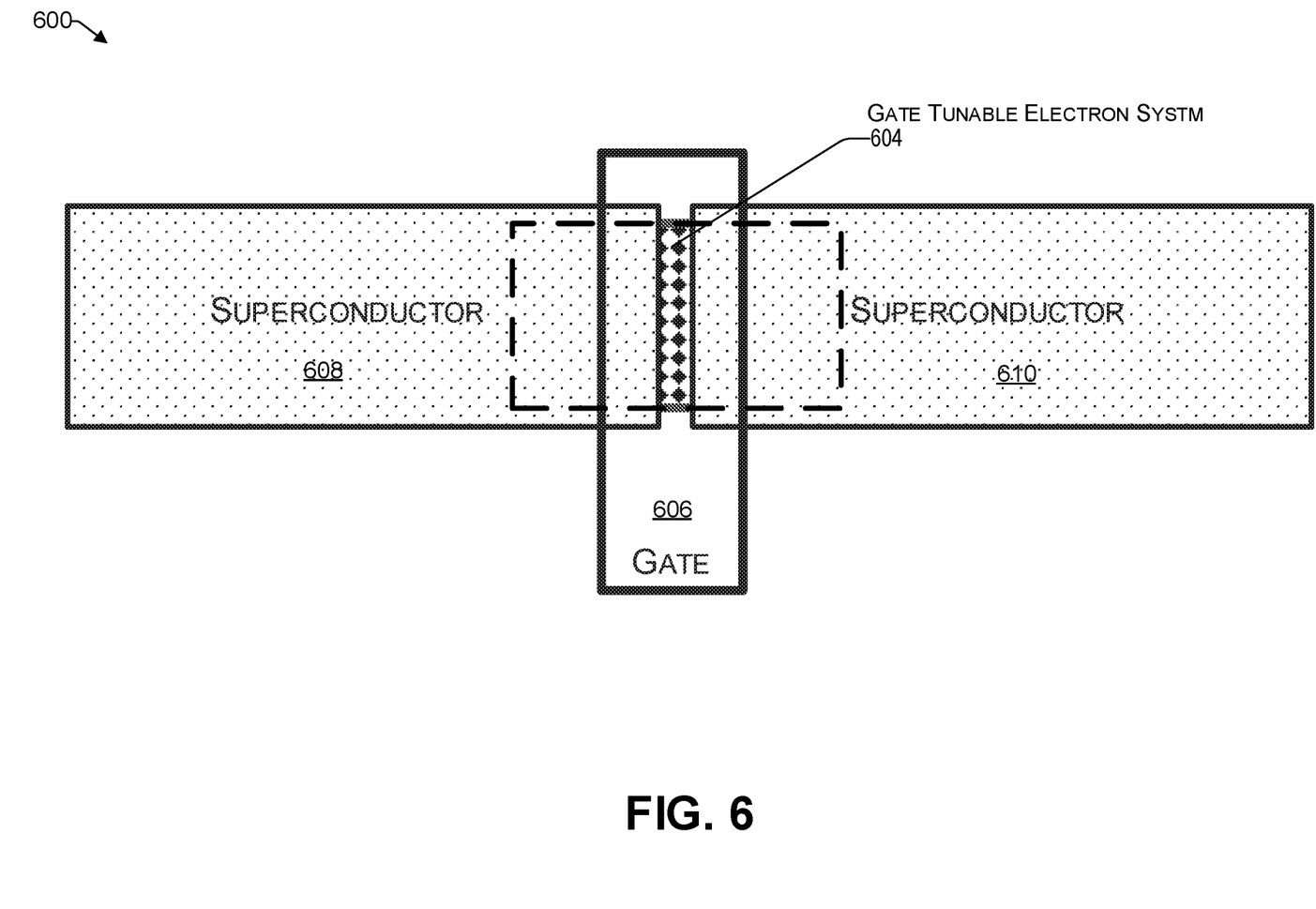
FIG. 6 illustrates an example switch that can be used to implement the switches of FIGS. 2 to 6, consistent with an illustrative embodiment.

FIG. 6 illustrates an example switch that can be used to implement the switches of FIGS. 2 to 6, consistent with an illustrative embodiment. For example, in FIG. 2, switch 600 can be used to implemented switches 208(1) to 208(8). According to another example, in FIG. 3, switch 600 can be used to implemented switches 302(1) to 302(12). The switch 600 of FIG. 6 is in the form of a gate-voltage-controlled switch integrated with a coupling resonator. The switch 600 includes a gate 606 that overlaps two superconductor structures 608 and 610. When an appropriate voltage is applied to the gate 606, the gate-tunable electron system 604 creates a path between the two superconductor structures 608 and 610. In one embodiment, the switch 600 is a Josephson Junction (JJ), which includes two or more superconductors (e.g., 608 and 610) that are coupled by a weak link provided by the gate-tunable electron system 604. In various configurations, the weak link of the gate tunable electron system 604 can comprise a short section of non-superconducting metal (S-N-S), or a physical constriction that weakens the superconductivity at the point of contact (S-s-S). In one embodiment, the switch 600 has a tunable Josephson inductance, thereby providing a tunable JJ.

Figure 7:
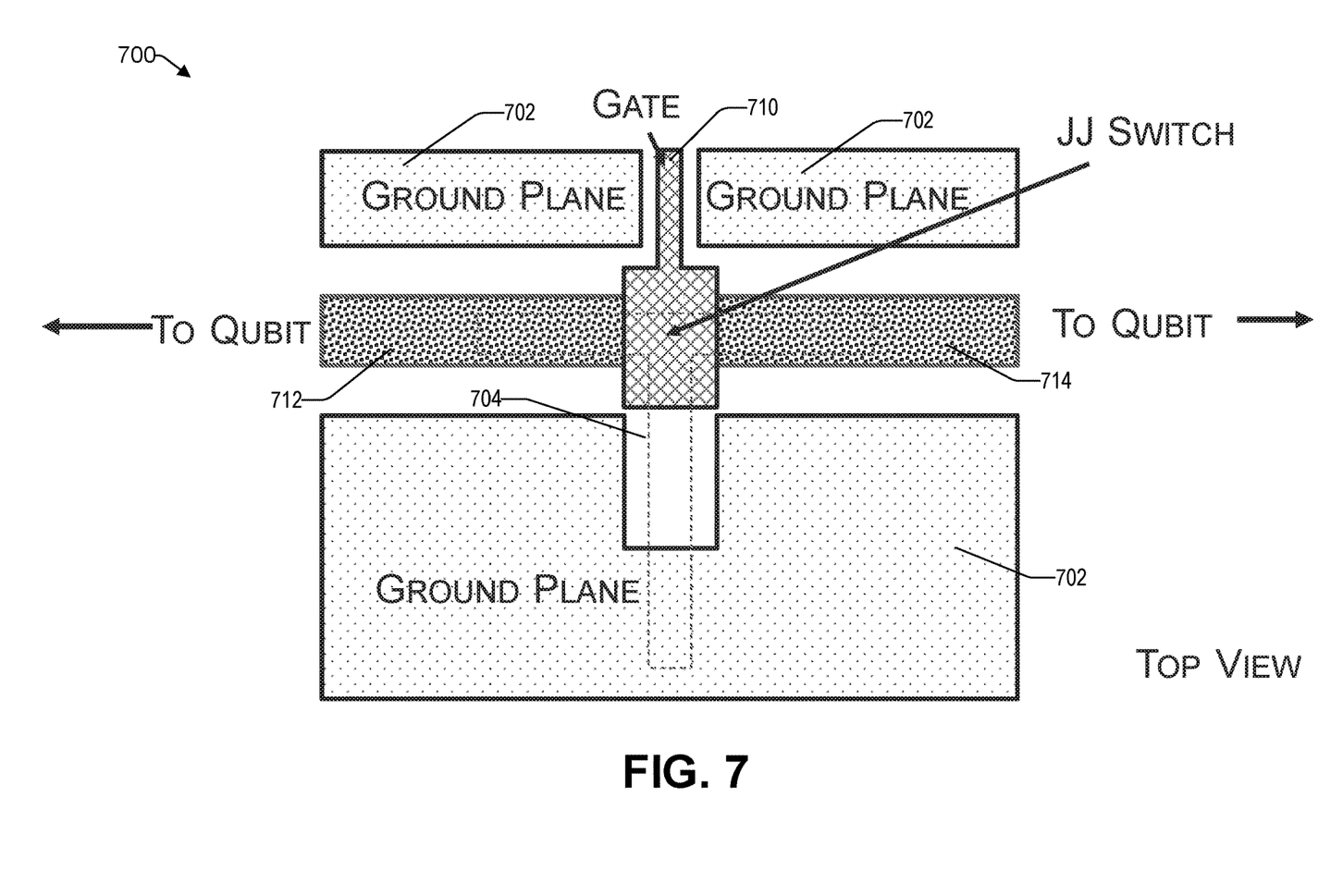
FIG. 7 illustrates a top view of a switch that can be used to provide an interruption between two qubits and/or a qubit and a readout resonator, consistent with an illustrative embodiment.

Reference now is made to FIG. 7, which illustrates a top view of a switch 700 with additional detail, consistent with an illustrative embodiment. In the example of FIG. 7, the switch 700 includes a gate 710 that overlaps two superconductor structures 712 and 714. The switch 700 may be a JJ that is substantially surrounded by a ground plane 702. Structure 704 represents a top view of a portion of a coplanar waveguide bus. The coplanar waveguide comprises ground planes and the center conductor. The portion of the waveguide that is shown in FIG. 7 includes the JJ switch. In the example of FIG. 7, the gate tunable electron system, outlined in a dotted line 704, forms a 'T' shape, the purpose of which is to use part of the electron system as a connection to ground. In various embodiments, the notch in the ground plane is not strictly necessary and other geometries could be used. The notch serves to illustrate the portion of the electron system that forms the contact to ground. Each superconducting structure 712 and 714 leads to a corresponding qubit.

Accordingly, a section of gate-tunable electron system 704 in the gate portion 710 (e.g., semiconductor, graphene, etc.), interrupts the superconducting resonator circuitry at key locations to form a switch. In various embodiments, the key locations may include between qubit pairs and/or between a qubit and a readout resonator. A voltage applied the (e.g., metal) gate 710 tunes the JJ switch between a low inductance state with high ($\approx$1-10 µA) critical current and a high inductance state with low ($\approx$10 nA) critical current, for example.

The switch described herein has fast switching times through tunable strong ZZ coupling. By way of example only and not by way of limitation, with a resistance of the switch of approximately 1 Kohm and a capacitance of 1 pF, switching times of 1 ns can be achieved.

In one embodiment, the switches discussed herein are voltage controlled super current switches. In contrast, magnetic flux control switches rely on current. The use of current can lead to additional cross-talk on the qubit chip, an additional heat load on the cryostat, and/or may require substantial additional overhead in terms of structures needed to produce the magnetic flux (such as a wire coil). By virtue of using voltage controlled super current switches, these issues related to flux-based approaches can be avoided.

Figure 8:
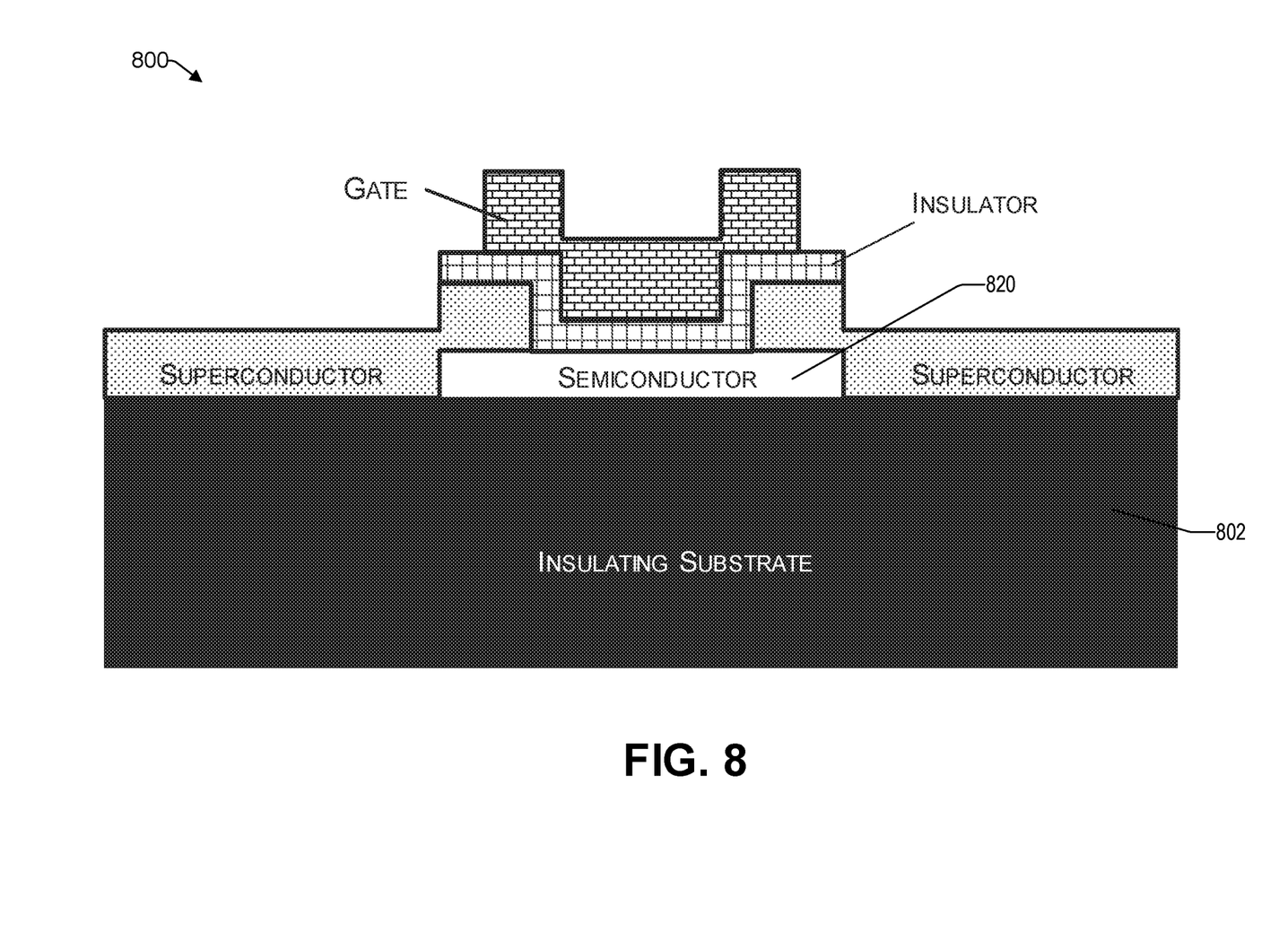
FIG. 8 is a side sectional view of a semiconductor structure that could be used as a Josephson Junction switch, consistent with an illustrative embodiment.

With the foregoing explanation of salient locations of switches and top views of the switches, it may be helpful to provide a high-level discussion of example cross-section of switches. To that end, FIGS. 8 to 12 provide different side cross-section views of various example switches that can be used to implement the JJ switches discussed herein. More specifically, FIG. 8 is a side sectional view of a semiconductor structure that could be used as a JJ switch, consistent with an illustrative embodiment. Semiconductor structure 800 includes an insulating substrate 802. There is a semiconductor 820 separating two superconductors deposited on the insulating substrate 802. In one embodiment, the semiconductor 820, sometimes referred to herein as the electron system, is Indium Arsenide (InAs).

Figure 9:
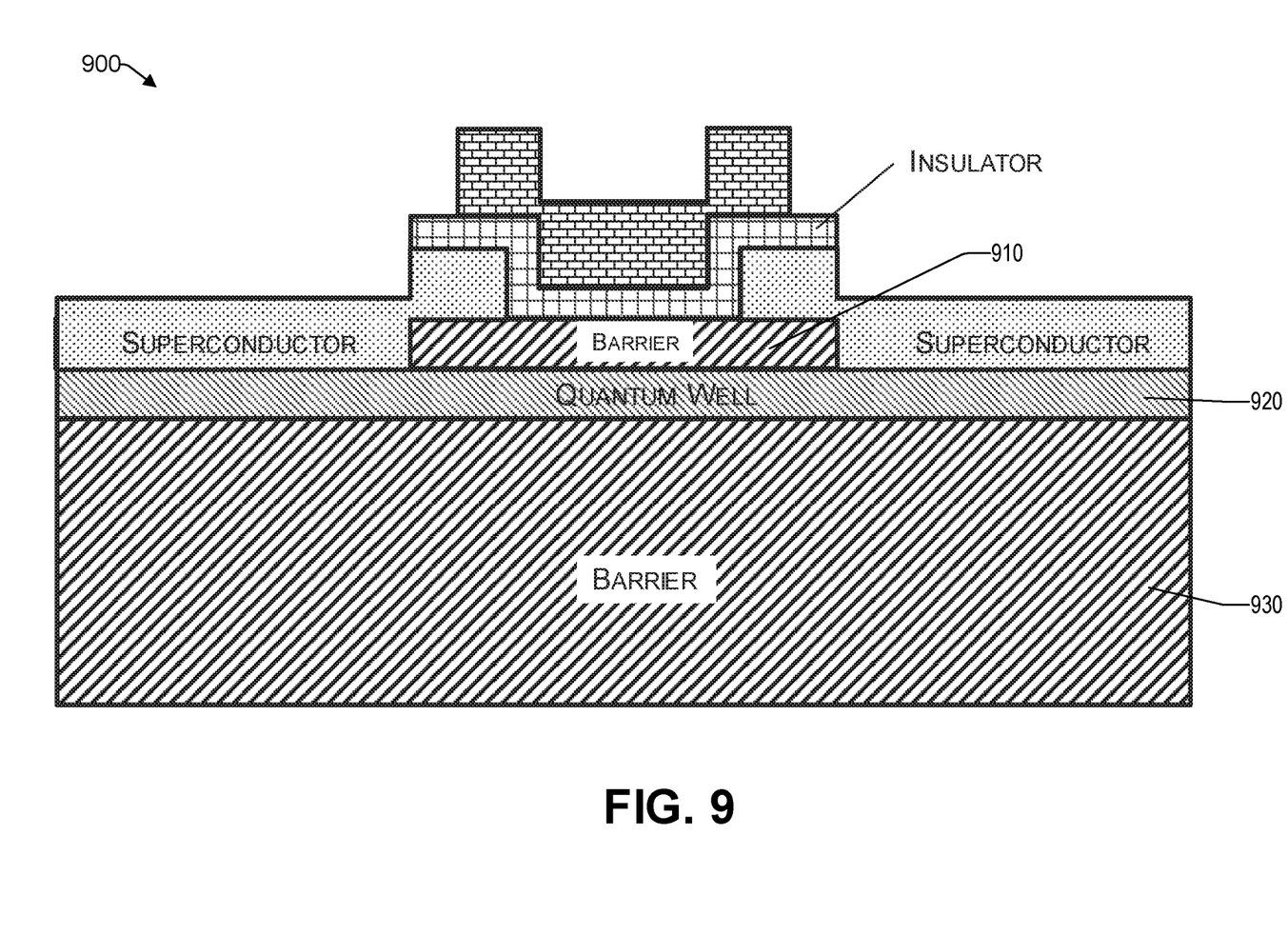
FIG. 9 is a side sectional view of a quantum well heterostructure used as a JJ switch, consistent with an illustrative embodiment.

FIG. 9 is a side sectional view of a quantum well heterostructure used as a JJ switch, consistent with an illustrative embodiment. In one embodiment, the semiconductor structure 900 includes a quantum well 920 constructed of InAs and barriers 910, 930 constructed of InGaAs. The barrier 910 separates two superconductor structures deposited on top of the quantum well 920. By virtue of using a quantum well 920, a higher mobility can be achieved, thereby being able to transport more electrons between the superconductor elements. In other embodiments, other semiconductors may be used. For example, the semiconductor structure may be constructed of a layer 920 of germanium (Ge), sandwiched by barriers 910 and 930 comprising silicon-germanium (SiGe).

Figure 10:
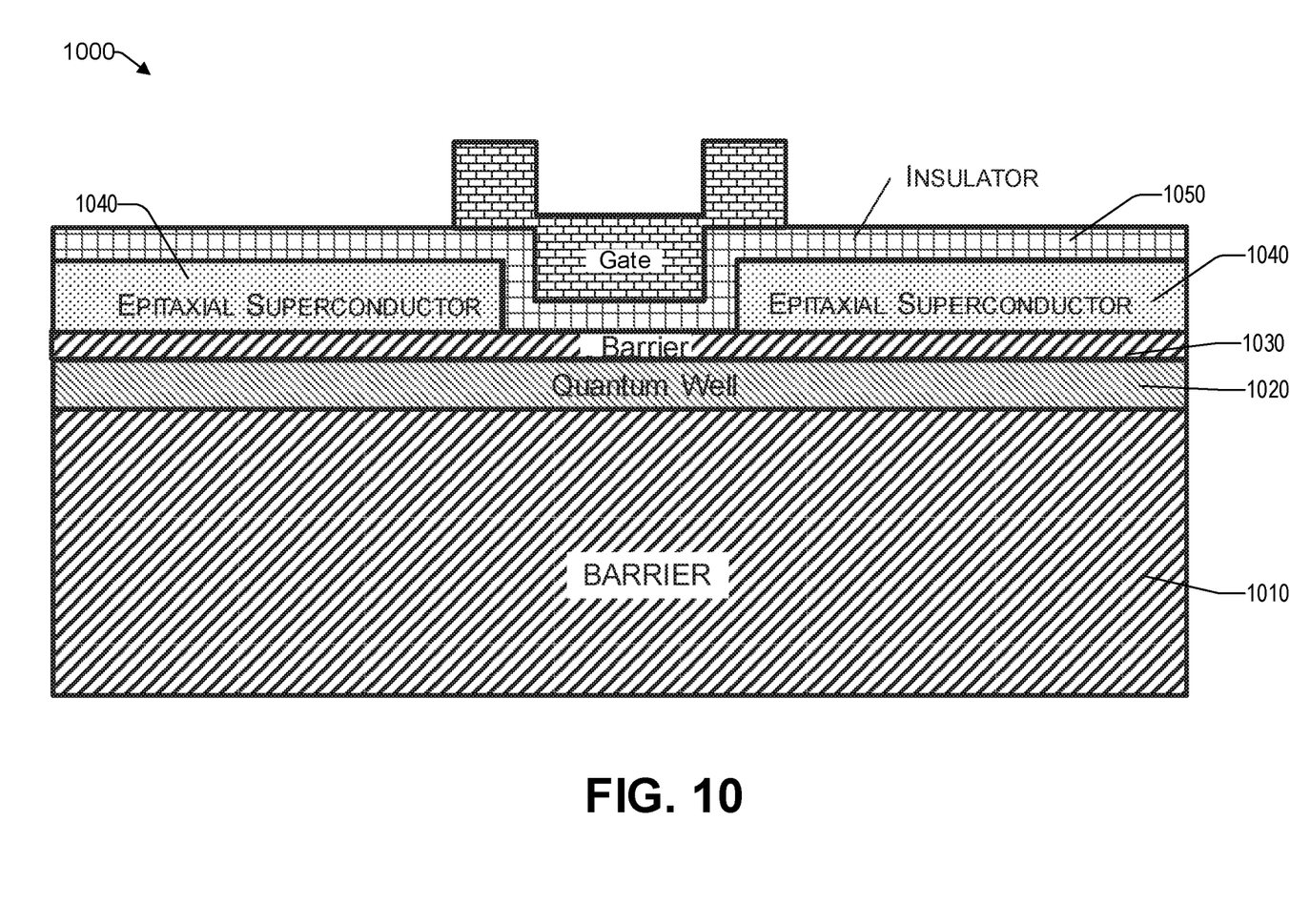
FIG. 10 is a side sectional view of a Josephson Junction switch having epitaxial superconductor structures on top of a barrier, consistent with an illustrative embodiment.

FIG. 10 is a side sectional view of a JJ switch having epitaxial superconductor structures 1040 on top of a barrier 1010, consistent with an illustrative embodiment. There is a first barrier layer 1030. A quantum well 1020 is constructed on top of the barrier layer 1010. There are two epitaxial superconductor segments 1040 that are separated by an insulator 1050.

In one embodiment, the quantum well 1020 of the semiconductor structure 1000 is constructed of InAs and barriers 1030, 1030 are constructed of InGaAs. There is a barrier 910 separating two superconductor structures deposited on top of the quantum well 920. For example, the semiconductor quantum well layer 1020 may be constructed of germanium (Ge) and the barriers 1010, 1030 comprise Silicon Germanium (SiGe).

Figure 11:
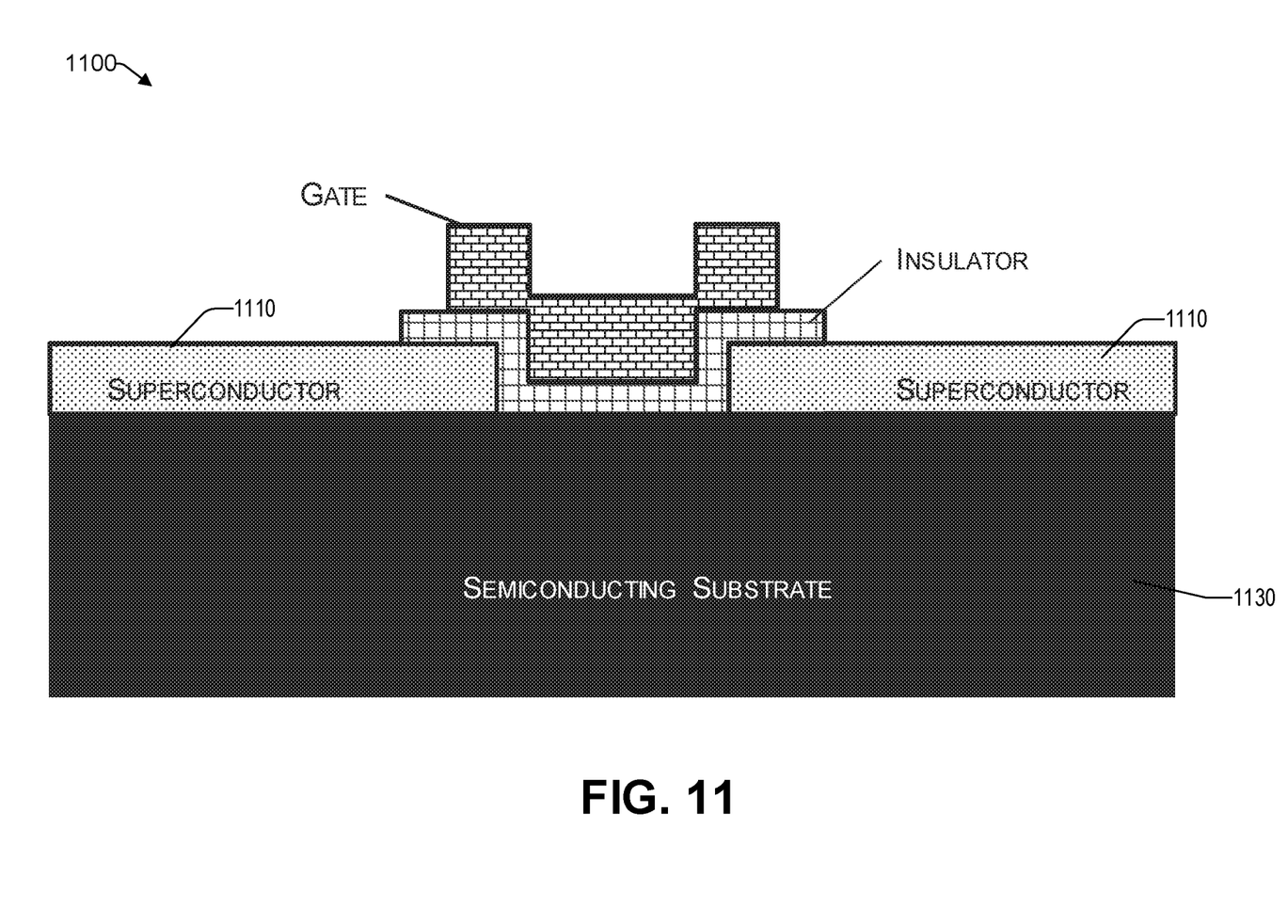
FIG. 11 is a side section view of a Josephson Junction switch where the superconductor structures are constructed directly on top of a semiconductor substrate, consistent with an illustrative embodiment.
Figure 12:
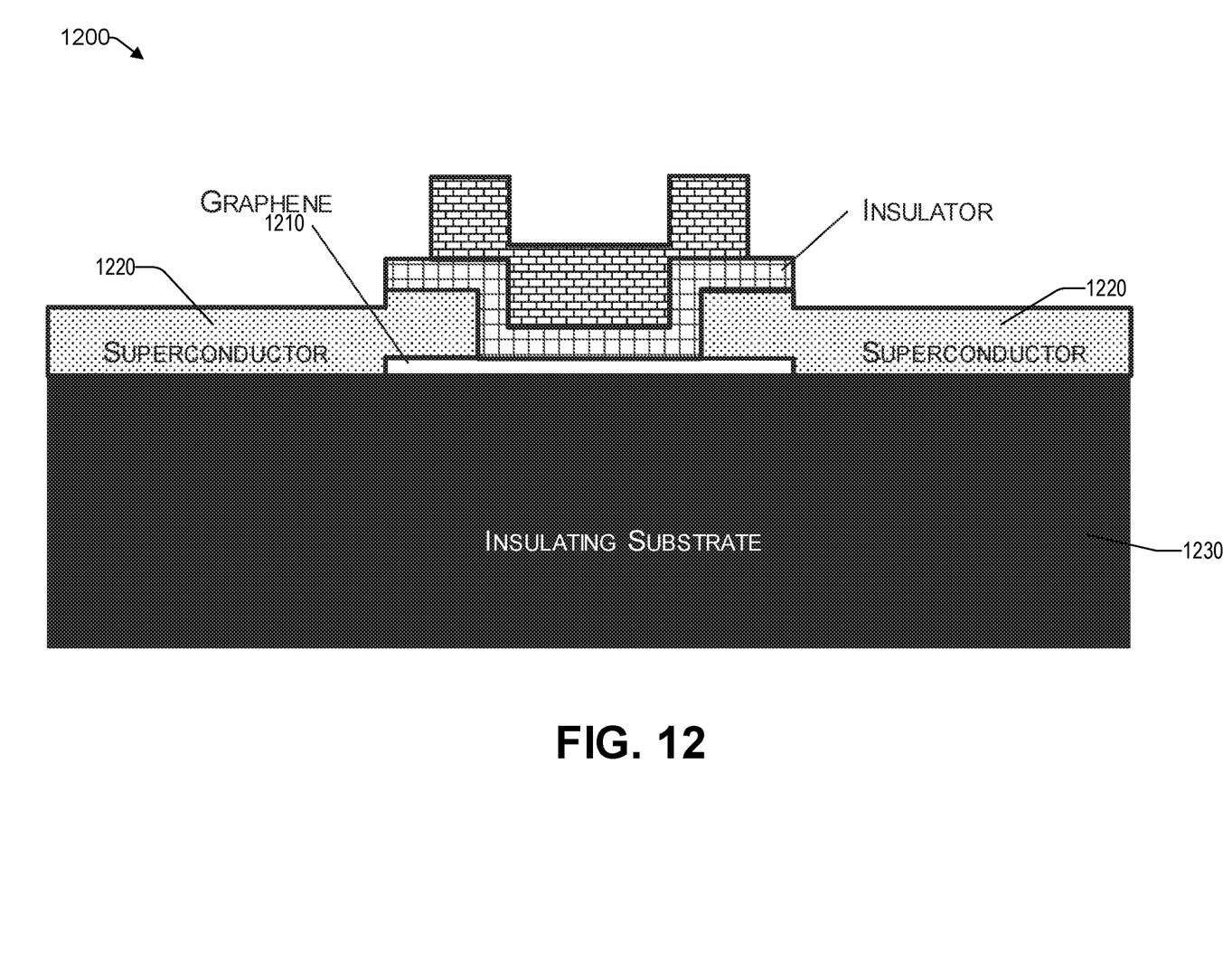
FIG. 12 provides a side section view of a Josephson Junction switch having a graphene layer between two superconductor structures, which is deposited on an insulating substrate.

Reference now is made to FIG. 11, which is a side section view of a JJ switch 1100 where the superconductor structures 1110 are constructed directly on top of a semiconductor substrate 1130, consistent with an illustrative embodiment. For example, such a JJ switch 1100 may be implemented to simplify and reduce the cost of the semiconductor process in producing the switch. In one embodiment, a graphene layer may be used to further enhance the performance of the JJ switch. In this regard, FIG. 12 provides a side section view of a JJ switch having a graphene layer 1210 between two superconductor structures 1220, which is deposited on an insulating substrate 1230.

CONCLUSION

The descriptions of the various embodiments of the present teachings have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

While the foregoing has described what are considered to be the best state and/or other examples, it is understood that various modifications may be made therein and that the subject matter disclosed herein may be implemented in various forms and examples, and that the teachings may be applied in numerous applications, only some of which have been described herein. It is intended by the following claims to claim any and all applications, modifications and variations that fall within the true scope of the present teachings.

The components, steps, features, objects, benefits and advantages that have been discussed herein are merely illustrative. None of them, nor the discussions relating to them, are intended to limit the scope of protection. While various advantages have been discussed herein, it will be understood that not all embodiments necessarily include all advantages. Unless otherwise stated, all measurements, values, ratings, positions, magnitudes, sizes, and other specifications that are set forth in this specification, including in the claims that follow, are approximate, not exact. They are intended to have a reasonable range that is consistent with the functions to which they relate and with what is customary in the art to which they pertain.

Numerous other embodiments are also contemplated. These include embodiments that have fewer, additional, and/or different components, steps, features, objects, benefits and advantages. These also include embodiments in which the components and/or steps are arranged and/or ordered differently.

While the foregoing has been described in conjunction with exemplary embodiments, it is understood that the term "exemplary" is merely meant as an example, rather than the best or optimal. Except as stated immediately above, nothing that has been stated or illustrated is intended or should be interpreted to cause a dedication of any component, step, feature, object, benefit, advantage, or equivalent to the public, regardless of whether it is or is not recited in the claims.

It will be understood that the terms and expressions used herein have the ordinary meaning as is accorded to such terms and expressions with respect to their corresponding respective areas of inquiry and study except where specific meanings have otherwise been set forth herein. Relational terms such as first and second and the like may be used solely to distinguish one entity or action from another without necessarily requiring or implying any actual such relationship or order between such entities or actions. The terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus. An element proceeded by "a" or "an" does not, without further constraints, preclude the existence of additional identical elements in the process, method, article, or apparatus that comprises the element.

The Abstract of the Disclosure is provided to allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in various embodiments for the purpose of streamlining the disclosure. This method of disclosure is not to be interpreted as reflecting an intention that the claimed embodiments have more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separately claimed subject matter.

What is claimed is:

1. A quantum system, comprising:
   a qubit array comprising a plurality of qubits;
   a bus resonator coupled between at least one pair of qubits of the plurality of qubits in the qubit array; and
   a switch coupled between the at least one pair of qubits, wherein:
      the switch comprises a coupling resonator having a Josephson Junction (JJ);
      the switch is integrated with a bus resonator; and
      the switch comprises a gate that is coupled to an electron system that is tunable by a voltage on the gate.

2. The quantum system of claim 1, wherein the electron system is configured to change an inductance based on the voltage on the gate.

3. The quantum system of claim 1, wherein the gate is configured to tune the electron system between (i) a low inductance state with a first critical current and (ii) a high inductance state with a second critical current, wherein the second critical current is lower than the first critical current.

4. The quantum system of claim 1, wherein:
   the switch has a first state that supports a supercurrent; and
   the switch has a second state that supports a high resistance and no supercurrent.

5. The quantum system of claim 1, wherein the voltage on the gate is configured to change an inductance of the JJ.

6. The quantum system of claim 1, wherein the switch comprises two or more superconductors that are separated by the electron system.

7. The quantum system of claim 6, wherein the electron system comprises graphene.

8. The quantum system of claim 1, wherein the switch is a voltage-controlled super current switch.

9. The quantum system of claim 1, further comprising, for at least one qubit of the qubit array, a second switch coupled between the at least one qubit and a readout resonator of the qubit array.

10. The quantum system of claim 9, wherein a combination of switches between given qubit pairs and qubits and readout resonators, is configured to multiplex individual qubits in the qubit array such that each qubit in the qubit array is individually controlled and independent of qubit frequency.

11. A quantum system, comprising:
    a qubit array comprising a plurality of qubits;
    a bus resonator coupled between at least one pair of qubits in the qubit array; and a switch coupled between the at least one pair of qubits, wherein:

the qubit array is part of a plurality of qubit arrays in a first layer; and the plurality of qubit arrays of the first layer are each isolated by one or more additional switches.

12. The quantum system of claim 11, wherein there is asymmetry in the qubit arrays between at least two layers of the plurality of qubit layers.

13. The quantum system of claim 11, wherein the quantum system comprises a plurality of layers, each having at least one qubit array separated by the one or more additional switches from adjacent layers.

14. The quantum system of claim 1, wherein two or more qubits in the qubit array have a substantially similar qubit frequency.

15. The quantum system of claim 11, wherein the multiple layers the first layer and the second layer are stacked on top of one another by way of bump bonding.

16. A method of controlling quantum system, comprising:
providing a qubit array having a plurality of qubits;
coupling a bus resonator between each pair of qubits in the qubit array;
at least one of:
separating at least one qubit pair of the qubit array by way of a Josephson Junction (JJ) switch; or
separating at least one qubit of the qubit array from a readout resonator by way of a second JJ switch; and
changing an inductance of an electron system by applying a voltage on a gate of the JJ switch.

17. A method of controlling quantum system, comprising:
providing a qubit array having a plurality of qubits;
coupling a bus resonator between each pair of qubits in the qubit array;
at least one of:
separating at least one qubit pair of the qubit array by way of a Josephson Junction (JJ) switch; or
separating at least one qubit of the qubit array from a readout resonator by way of a second JJ switch; and
separating two or more superconductors by the electron system of the JJ switch.

18. The method of claim 16, further comprising multiplexing individual qubits of the qubit array by a plurality of switches including the JJ switch and the second JJ switch in the qubit array, such that each qubit in the qubit array is individually controlled and independent of qubit frequency.

19. The method of claim 16, further comprising:
stacking a plurality of qubit arrays on a plurality of layers; and
individually controlling each qubit of the plurality of layers by a plurality of switched and independent of qubit frequency.

20. A quantum system, comprising:
a qubit array comprising a plurality of qubits;
a bus resonator coupled between each pair of adjacent qubits in the qubit array; and
at least one of:
a switch coupled between each qubit pair of the qubit array; or
for at least one qubit of the qubit array, a switch between the at least one qubit and a readout resonator of the qubit array, wherein:
the switch is integrated with a coupling resonator having a Josephson Junction (JJ);
each switch comprises a gate that is coupled to an electron system that is tunable by a voltage on the gate; and
the electron system is configured to change an inductance of the JJ based on a voltage on the gate.

21. The quantum system of claim 20, wherein a combination of switches between given qubit pairs, and qubits and readout resonators, is configured to multiplex individual qubits in the array such that each qubit in the qubit array is individually controlled independent of qubit frequency.

* * * * *